US012609674B2

(12) United States Patent
Lee et al.

(10) Patent No.: US 12,609,674 B2
(45) Date of Patent: Apr. 21, 2026

(54) FULL TRANSMISSION DEVICE FOR WIDE-ANGLE MODE CONVERSION OF ELASTIC WAVES

(71) Applicants: Seoul National University R&DB Foundation, Seoul (KR); CENTER FOR ADVANCED META-MATERIALS, Daejeon (KR)

(72) Inventors: Jeseung Lee, Anyang-si (KR); Gihyun Kim, Seoul (KR); Yoon Young Kim, Seoul (KR)

(73) Assignees: SEOUL NATIONAL UNIVERSITY R&DB FOUNDATION, Seoul (KR); CENTER FOR ADVANCED META-MATERIALS, Daejeon (KR)

( * ) Notice: Subject to any disclaimer, the term of this patent is extended or adjusted under 35 U.S.C. 154(b) by 0 days.

(21) Appl. No.: 18/275,641

(22) PCT Filed: Jun. 5, 2023

(86) PCT No.: PCT/KR2023/007701
§ 371 (c)(1),
(2) Date: Aug. 3, 2023

(87) PCT Pub. No.: WO2023/243919
PCT Pub. Date: Dec. 21, 2023

(65) Prior Publication Data
US 2025/0105821 A1 Mar. 27, 2025

(30) Foreign Application Priority Data
Jun. 14, 2022 (KR) ........................ 10-2022-0072319

(51) Int. Cl.
*H03H 9/24* (2006.01)
(52) U.S. Cl.
CPC .................................... *H03H 9/24* (2013.01)

(58) Field of Classification Search
CPC ........ H03H 9/24; H03H 9/02; H03H 9/02062; H03H 9/0211; G10K 11/16
See application file for complete search history.

(56) References Cited

U.S. PATENT DOCUMENTS

| 2018/0102755 A1 | 4/2018 | Takamine | |
| 2025/0037689 A1* | 1/2025 | Kim | A61N 7/00 |
| 2025/0105821 A1* | 3/2025 | Lee | G10K 11/16 |

FOREIGN PATENT DOCUMENTS

| KR | 10-1807553 | 1/2018 |
| KR | 10-1856201 | 5/2018 |

(Continued)

OTHER PUBLICATIONS

Sung Won Lee et al., "Broad-angle refractive transmodal elastic metasurface", Applied Physics Letters 117, 213502, Nov. 23, 2020.
(Continued)

*Primary Examiner* — Daniel Pihulic
(74) *Attorney, Agent, or Firm* — LEX IP MEISTER, PLLC

(57) ABSTRACT

An exemplary embodiment attempts to provide a full transmission device for wide-angle mode conversion of elastic waves which can realize mode conversion of elastic waves with high energy efficiency over a wide range of angle of incidence by a single filter. A full transmission device for wide-angle mode conversion of elastic waves includes an incidence medium where elastic waves including longitudinal waves and transverse waves enter obliquely within a preset wide angle range, a transmission medium that transmits elastic waves when the elastic waves enter the transmission medium within the wide angle range through the incidence medium, and a filter that is formed so as to satisfy a wide-angle mode conversion full-transmission condition when the filter is interposed between the incidence medium and the transmission medium, such that elastic waves enter-
(Continued)

ing the incidence medium within the wide angle range are completely converted without being reflected so as to be transmitted to the transmission medium.

6 Claims, 17 Drawing Sheets

(56)                    References Cited

FOREIGN PATENT DOCUMENTS

| KR | 10-2336714 | 12/2021 | | |
|---|---|---|---|---|
| KR | 10-2022-0059226 | 5/2022 | | |
| KR | 10-2023-0026804 | 2/2023 | | |
| KR | 20230171767 A * | 12/2023 | .............. | H03H 9/24 |
| KR | 102787181 B1 * | 3/2025 | .............. | H03H 9/24 |
| WO | WO-2023243919 A1 * | 12/2023 | .............. | H03H 9/24 |
| WO | WO-2024210266 A1 * | 10/2024 | .......... | B06B 1/0207 |

OTHER PUBLICATIONS

Min Soo Kim et al., "Transmodal elastic metasurface for broad angle total mode conversion", Applied Physics Letters 112, 241905, Jun. 15, 2018.
KIPO, Search Report and Written Opinion of PCT/KR2023/007701 dated Sep. 18, 2023.

* cited by examiner

FULL TRANSMISSION DEVICE FOR WIDE-ANGLE MODE CONVERSION OF ELASTIC WAVES

TECHNICAL FIELD

A full transmission device for wide-angle mode conversion of elastic waves is provided.

BACKGROUND ART

When a wave travels through a layer, multiple internal reflection and interference phenomena occur within the layer. In this case, a frequency at which half the wavelength of an incident wave is equal to the thickness of the layer is referred to as a Fabry-Perot resonance frequency, and a wave entering with such a Fabry-Perot resonance frequency completely (100%) passes through the layer.

As the wave modes of elastic waves, there are longitudinal waves (compression waves) and transverse waves (shear waves). In this case, a longitudinal wave entering an anisotropic layer with properties satisfying special conditions may be modally converted into a transverse wave or a transverse wave into a longitudinal wave, which can completely pass through the layer. This phenomenon is referred to as transmodal Fabry-Perot resonance (TFPR). However, the phenomenon in which the modes of elastic waves are converted has limitation in that it is realized only when elastic waves enters an anisotropic layer at a specific angle of incidence.

In order to overcome this limitation of existing filters for mode conversion, it is required to develop a technology for realizing mode conversion of elastic waves with high energy efficiency over a wide range of angle of incidence by a single filter.

DISCLOSURE

Technical Problem

An exemplary embodiment attempts to provide a full transmission device for wide-angle mode conversion of elastic waves which can realize mode conversion of elastic waves with high energy efficiency over a wide range of angle of incidence by a single filter.

Technical Solution

A full transmission device for wide-angle mode conversion of elastic waves includes an incidence medium where elastic waves including longitudinal waves and transverse waves enter obliquely within a preset wide angle range, a transmission medium that transmits elastic waves when the elastic waves enter the transmission medium within the wide angle range through the incidence medium, and a filter that is formed so as to satisfy a wide-angle mode conversion full-transmission condition when the filter is interposed between the incidence medium and the transmission medium, such that elastic waves entering the incidence medium within the wide angle range are completely converted without being reflected so as to be transmitted to the transmission medium.

The filter may include an elastic metamaterial that is smaller than the wavelength of the elastic waves entering the incidence medium, and the elastic metamaterial may include at least one microstructure with a continuous array and tilted with respect to a direction of the incidence direction of the elastic wave or asymmetric with respect to the incidence axis of the elastic wave.

The full wide-angle mode-converting transmission condition may include a plurality of design variables. In addition, a plurality of microstructures which is formed in a shape preset by the plurality of design variables may be continuously arranged so as to gradually vary in the propagation direction of waves, thereby forming repeating unit cells.

The microstructures may have slit-like voids.

The microstructures may be formed in a shape that is inclined at a preset angle in a two-dimensional plane.

The plurality of design variables may include a plurality of shape design variables that determines the shape of the microstructures, and a plurality of position design variables that determine the positions of the microstructures.

The plurality of design variables may include twenty-two design variables.

The wide angle range may include from about 0° to about 70°.

The boundary shape of the unit cells may include a polygonal shape, such as a rectangular shape, a parallelogrammic shape, a hexagonal shape, etc., in two dimensions.

The boundary shape of the unit cells may include a polyhedral shape such as a hexahedral shape, a prismatic shape, etc., in three dimensions.

Two holes that are on the inner side of the unit cell may be formed by a combination of six design variables that determine their shapes and four design variables that determine their positions.

Three holes that are on the outer side of the unit cell may be formed by a combination of nine design variables that determine their shapes and one design variable that determines their positions.

Advantageous Effects

There is an effect that it is possible to realize free mode conversion between longitudinal waves and transverse waves without reflected waves over a wide range of angle of incidence by using anisotropy.

3

Figure 4A:
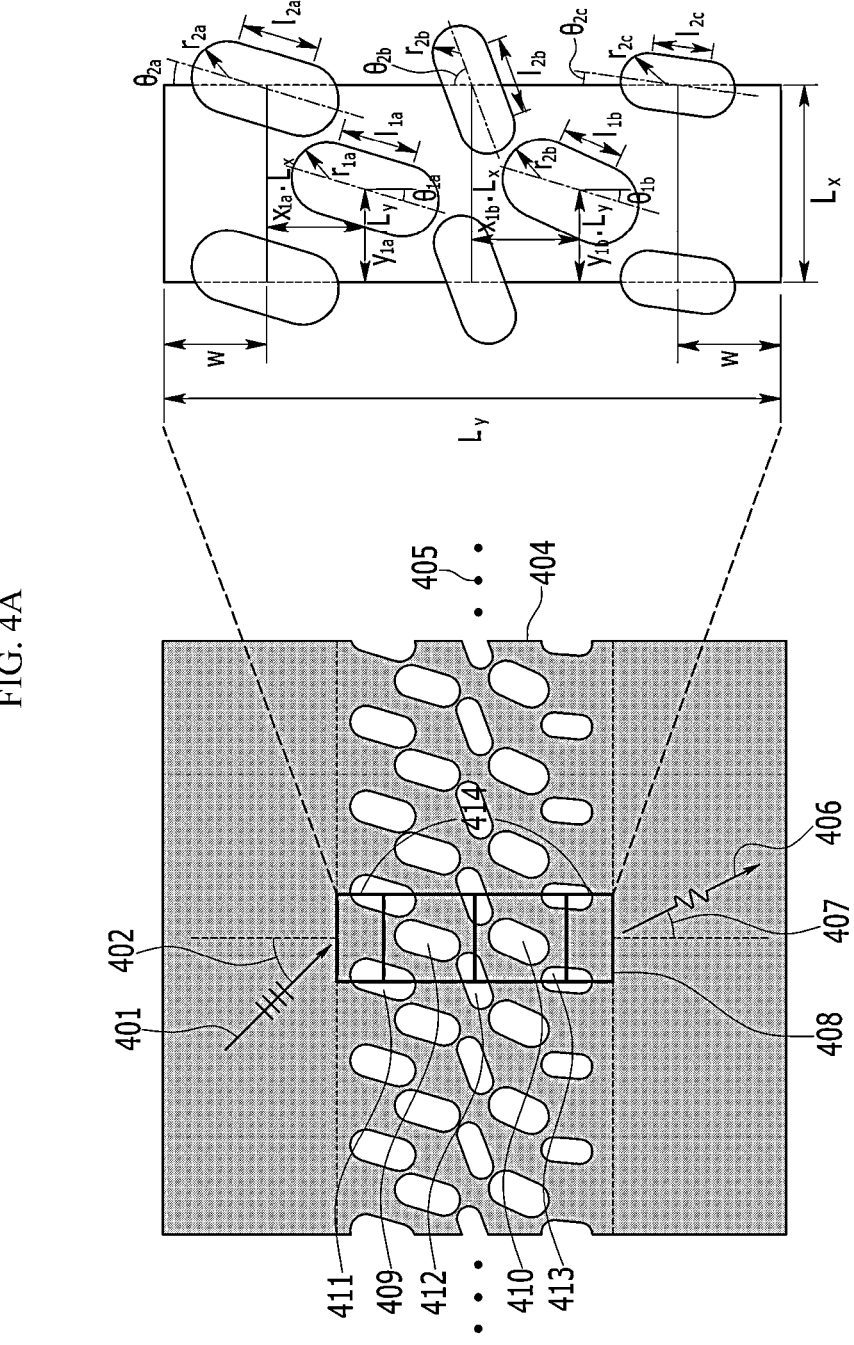

FIG. 4A is a drawing illustrating a situation where wide-angle mode conversion from longitudinal waves to transverse waves is realized using the unit cell shape of an elastic metamaterial.

Figure 4B:
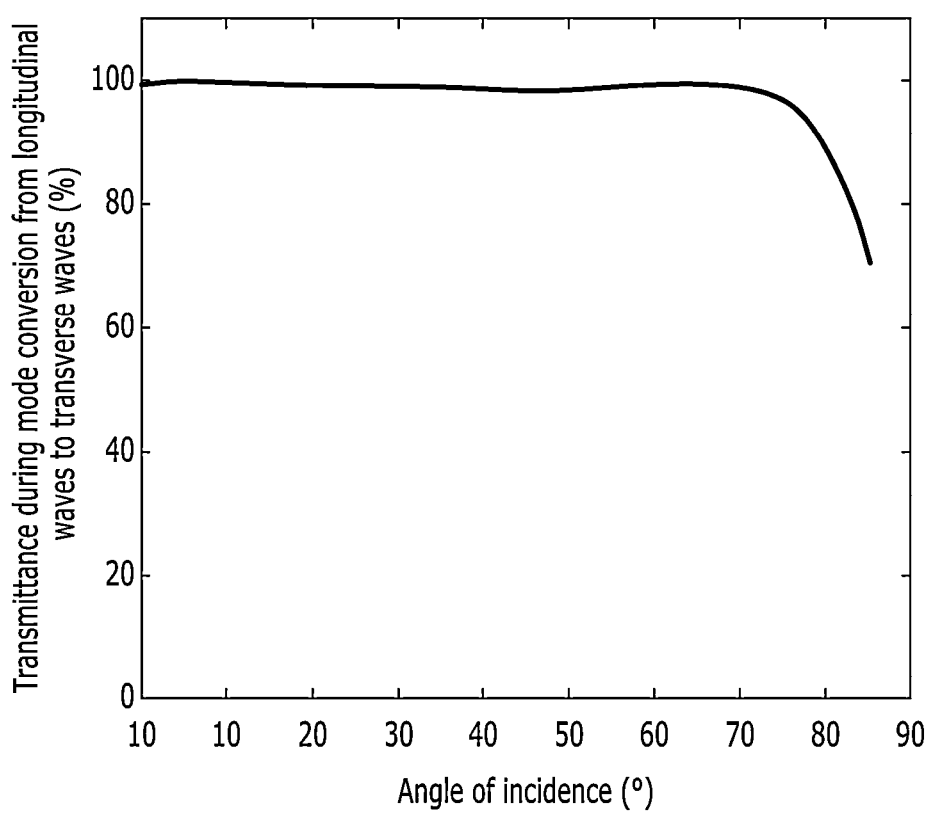

FIG. 4B is a drawing illustrating a graph of the transmittance of the filter during mode conversion from longitudinal waves to transverse waves.

Figure 4C:
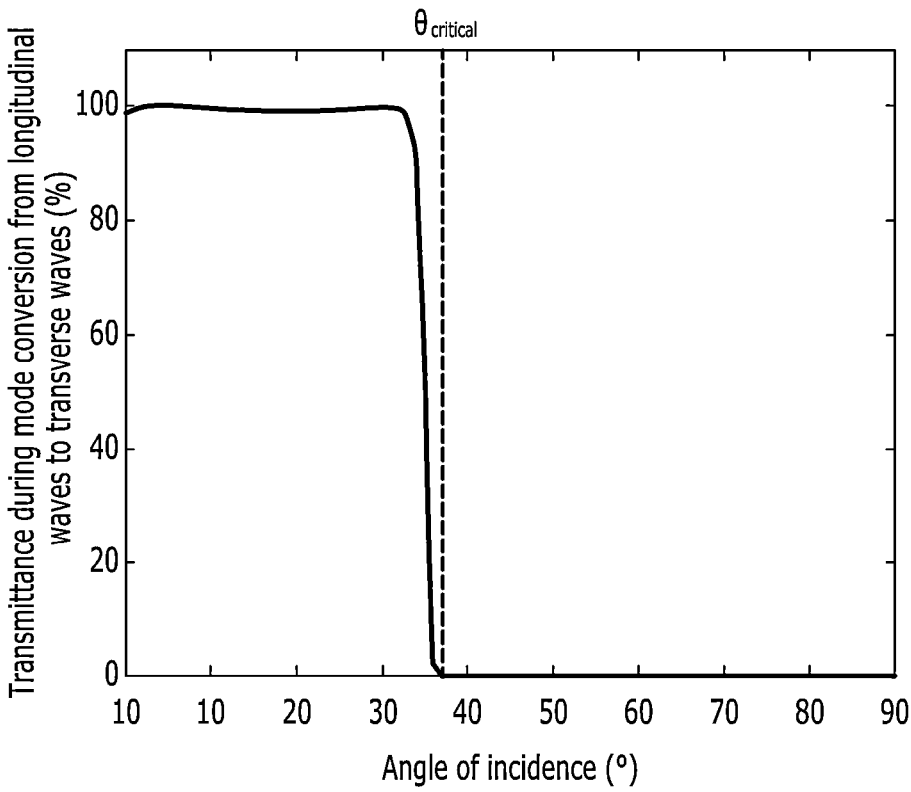

FIG. 4C is a drawing illustrating a graph of the transmittance of the filter during mode conversion from transverse waves to longitudinal waves.

Figure 5:
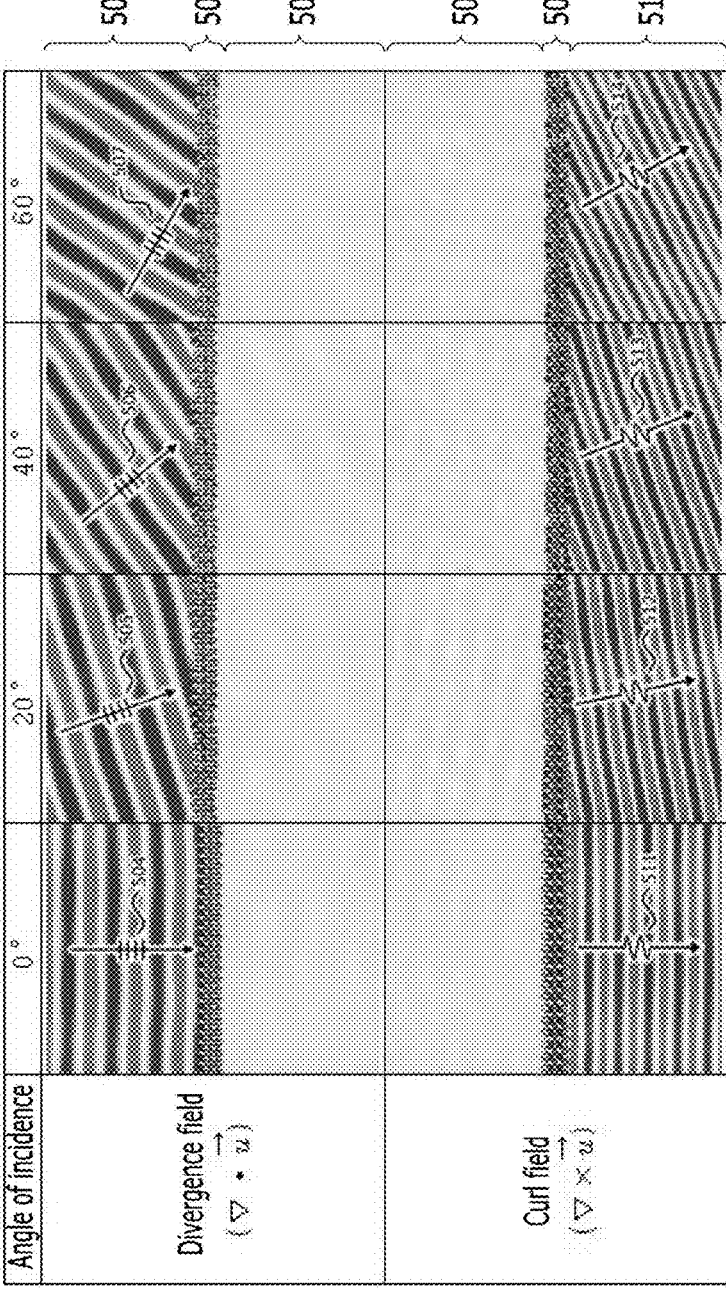

FIG. 5 is a drawing illustrating the results of simulation analysis of divergence fields and curl fields when longitudinal waves entered a filter for wide-angle mode conversion.

Figure 6:
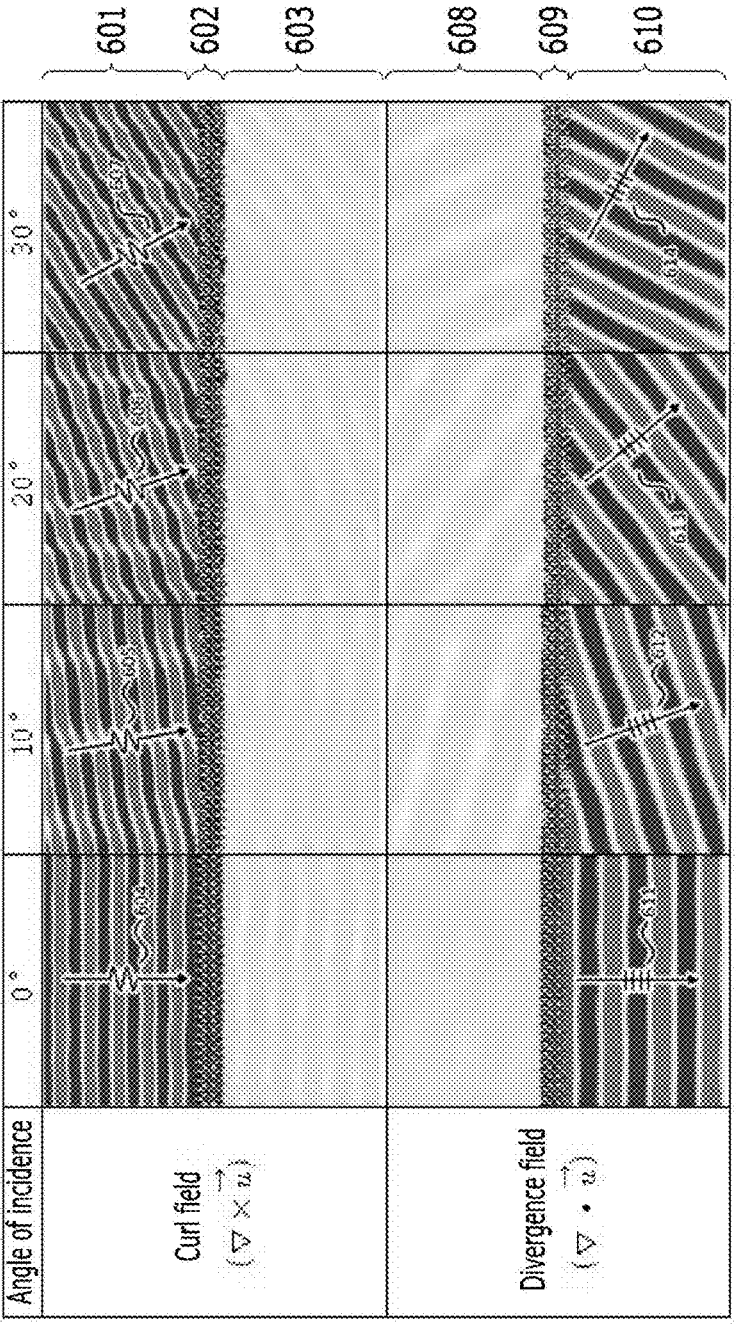

FIG. 6 is a drawing illustrating the results of simulation analysis of divergence fields and curl fields when transverse waves entered a filter for wide-angle mode conversion.

MODE FOR INVENTION

Technical terms used here are to only describe a specific exemplary embodiment and are not intended to limit the present invention. Technical terms used here are to only describe a specific exemplary embodiment and are not intended to limit the present invention. A meaning of "comprising" used in a specification embodies a specific characteristic, area, integer, step, operation, element and/or component and does not exclude presence or addition of another specific characteristic, area, integer, step, operation, element, component and/or group.

Although not differently defined, entire terms including a technical term and a scientific term used here have the same meaning as a meaning that may be generally understood by a person of common skill in the art. It is additionally analyzed that terms defined in a generally used dictionary have a meaning corresponding to a related technology document and presently disclosed contents and are not analyzed as an ideal or very official meaning unless stated otherwise.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

A full transmission device for wide-angle mode conversion of elastic waves according to an exemplary embodiment may include an incidence medium, a transmission medium, and a filter, and realize mode conversion of elastic waves with high energy efficiency over a wide range of angle of incidence by using a single filter.

Incidence media may include media which elastic waves including longitudinal waves and transverse waves enter obliquely within a preset wide angle range. The wide angle range may include, for example, from about 0° to about 70°.

Transmission media may include media which transmit elastic waves when the elastic waves enter the media within a wide angle range through incidence media.

The filter may be interposed between an incidence medium and a transmission medium. The filter may be formed so as to satisfy a full wide-angle mode-converting transmission condition when the filter, such that elastic waves entering the incidence medium within a wide angle range are completely converted without being reflected and are transmitted to the transmission medium. For example, the filter may contain an elastic metamaterial the is smaller than the wavelengths of elastic waves entering the incidence medium. Such an elastic metamaterial may include at least one microstructure with a continuous array. The one microstructure is inclined with respect to the incidence direction of elastic waves or are asymmetric with respect to the incidence axis of elastic waves.

The full wide-angle mode-converting transmission condition may include a plurality of design variables. A plurality of microstructures which is formed in a shape preset by the plurality of design variables may be continuously arranged so as to gradually vary in the propagation direction of waves, thereby forming repeating unit cells. The microstructures may have slit-like voids. The microstructures may be formed in a shape that is inclined at a preset angle in a two-dimensional plane. The plurality of design variables may include a plurality of shape design variables that determines the shape of the microstructures, and a plurality of position design variables that determines the positions of the microstructures.

The boundary shape of the unit cells may include a polygonal shape, such as a rectangular shape, a parallelogrammic shape, a hexagonal shape, etc., in two dimensions. Further, the boundary shape of the unit cells may include a polyhedral shape such as a hexahedral shape, a prismatic shape, etc., in three dimensions.

As described above, the full transmission device for wide-angle mode conversion of elastic waves according to the exemplary embodiment may realize free mode conversion between longitudinal waves (compression waves) and transverse waves (shear waves) without reflected waves within a wide range of angle of incidence (from about 0° to about 70°) by using the single filter. Accordingly, an embodiment can solve the problem that the existing filters for mode conversion on elastic waves work on only a single angle of incidence.

The full transmission device for wide-angle mode conversion of elastic waves according to the exemplary embodiments may realize the phenomenon of full mode-converting transmission of elastic waves with energy efficiency close to about 100% without reflected waves over a wide range of angle of incidence, using anisotropy. Elastic waves which are dealt with in the exemplary embodiment may include in-plane planar harmonic waves which can travel in an isotropic elastic medium under a plane-strain or plane-stress condition. In the elastic wave, wave modes may include compression waves (P-waves) which are longitudinal waves, and shear waves (SV-waves) which are transverse waves.

Figure 1A:
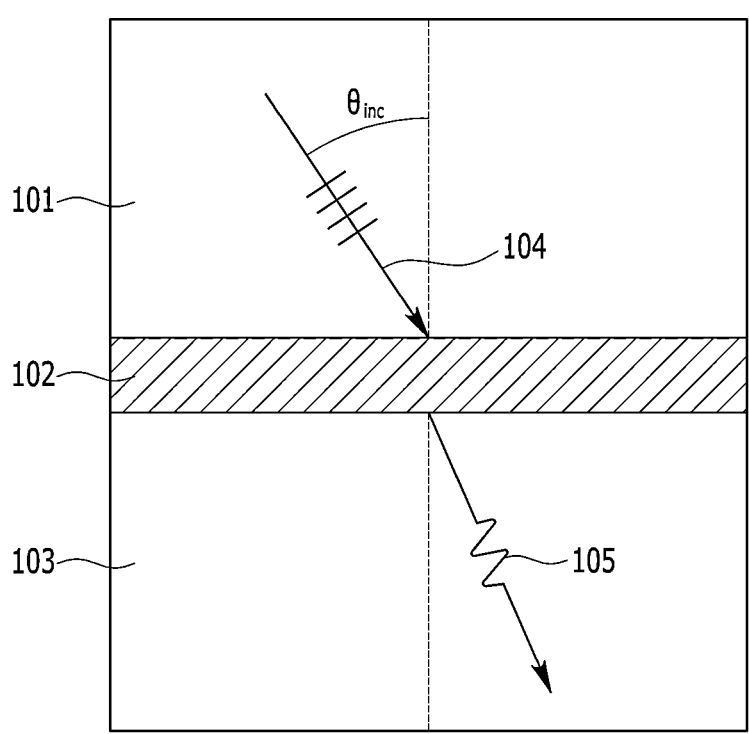
FIG. 1A and FIG. 1B are drawings illustrating conceptual views of a filter according to an exemplary embodiment, which realizes full transmission using mode conversion from longitudinal waves to transverse waves and full transmission using mode conversion from transverse waves to longitudinal waves without reflected waves.
Figure 1B:
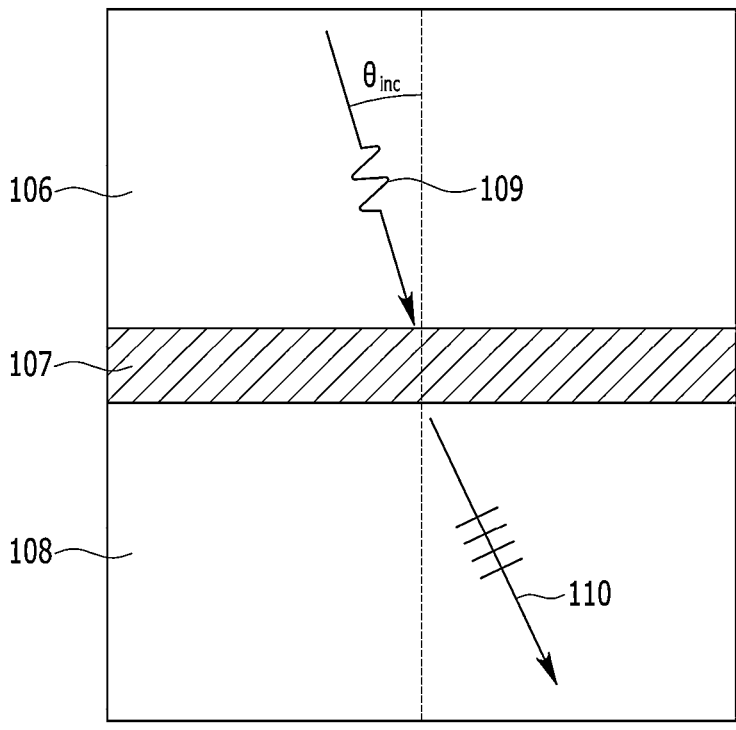

FIG. 1A and FIG. 1B are drawings illustrating conceptual views of a filter according to an exemplary embodiment, which realizes full transmission using mode conversion from longitudinal waves to transverse waves and full transmission using mode conversion from transverse waves to longitudinal waves without reflected waves, respectively. Referring to FIG. 1A, when a filter 102 is interposed between an incidence medium 101 and a transmission medium 103, a longitudinal wave 104 entering the filter 102 is completely converted into a transverse wave 105, which can be transmitted without being reflected. The filter 102 according to the exemplary embodiment may act with high energy efficiency (equal to or higher than about 99%) within a wide range of angle of incidence (about $0° \le \theta_{inc} <$ about 70°). In this case, the refraction angle of the transverse wave which is transmitted may be determined by the angle of incidence of the longitudinal wave and the properties of a background medium.

Referring to FIG. 1B, when a filter 107 shown in FIG. 1A is rotated 180 degrees and is interposed between an incidence medium 106 and a transmission medium 108, a transverse wave 109 entering the filter 107 is completely converted into a longitudinal wave 110, thereby being capable of being transmitted without being reflected by the principle of symmetry. In this case, the refraction angle of the longitudinal wave which is transmitted may be determined by the angle of incidence of the transverse wave and the properties of a background medium.

Figure 2A:
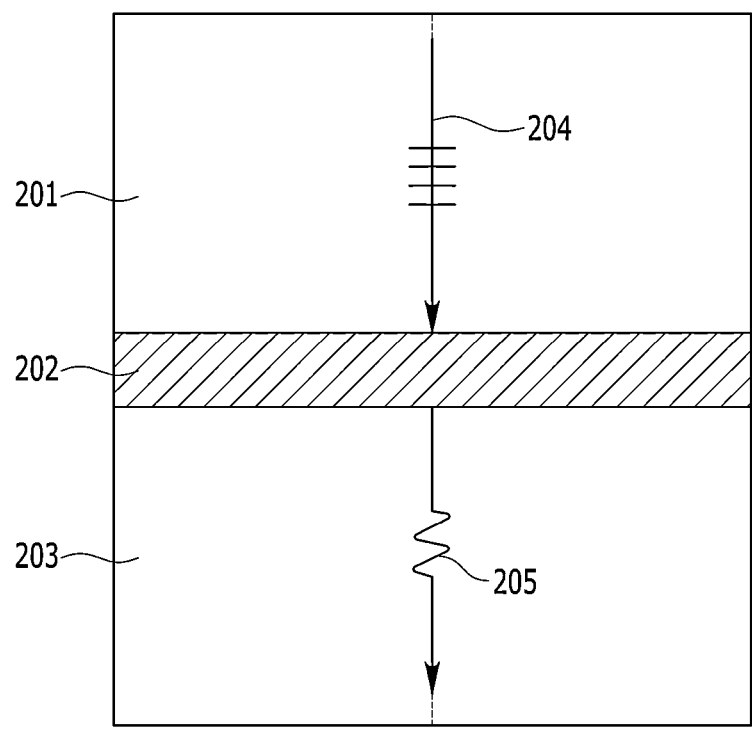
FIG. 2A and FIG. 2B are drawings illustrating conceptual views in which full transmission using mode conversion from longitudinal waves to transverse waves according to the related art are realized.
Figure 2B:
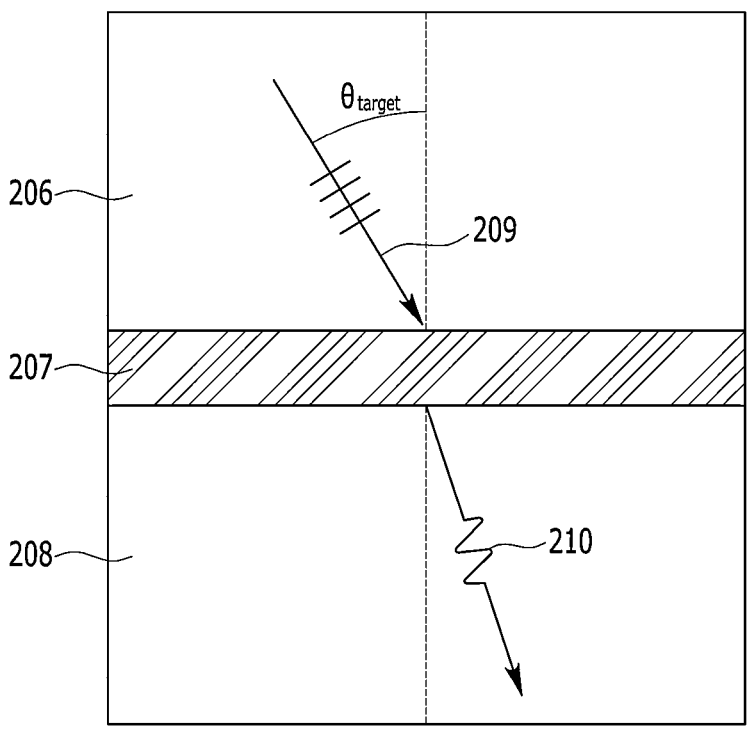
Figure 2C:
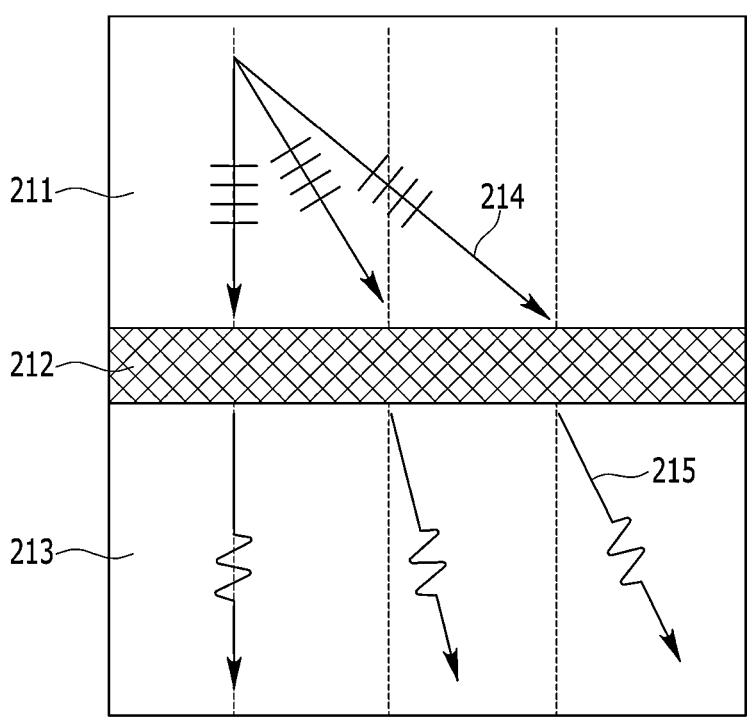
FIG. 2C is a drawing illustrating a conceptual view in which full transmission using mode conversion from longitudinal waves to transverse waves according to the exemplary embodiment is realized.
Figure 2D:
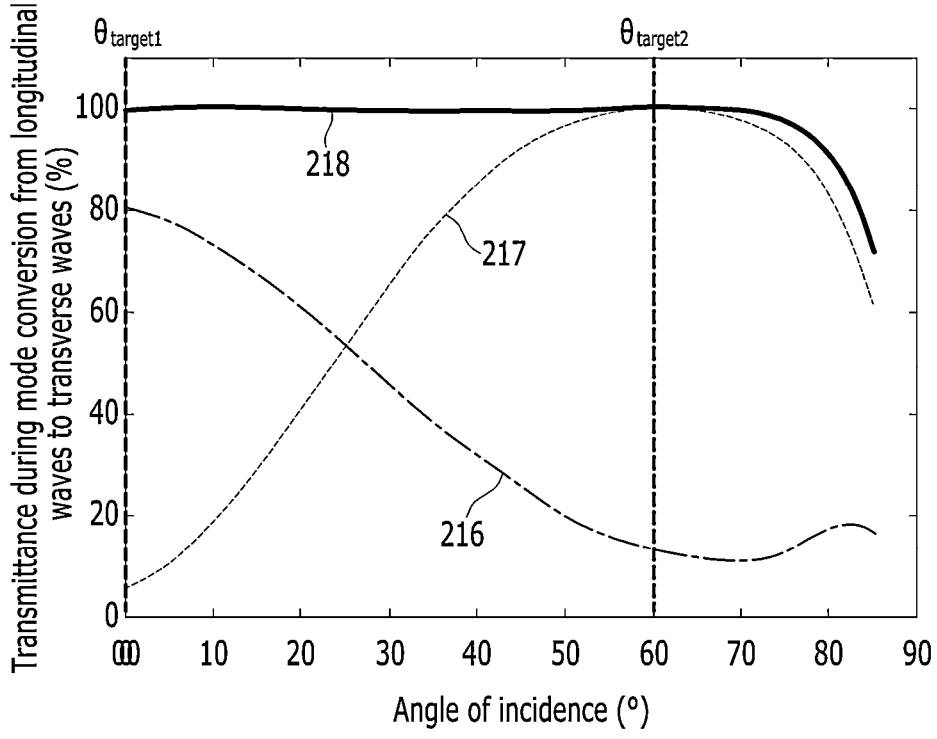
FIG. 2D is a drawing illustrating a graph in which mode-converting transmittances depending on angles of incidence are compared.

The filter according to the exemplary embodiment can realize the full mode-converting transmission phenomenon of elastic waves without reflected wave over a wide range of angle of incidence, not at a single angle of incidence. Accordingly, the limitation of the related art that acts on only a single target angle of incidence can be overcome. FIG. 2A and FIG. 2B are drawings illustrating conceptual views in which full transmission using mode conversion from longitudinal waves to transverse waves according to the related art are realized, and FIG. 2C is a drawing illustrating a conceptual view in which full transmission using mode conversion from longitudinal waves to transverse waves is realized utilizing the exemplary embodiment. FIG. 2D is a drawing illustrating a graph in which transmittances during mode conversion depending on angles of incidence according to the related art and the exemplary embodiment are compared.

FIG. 2A is a drawing illustrating a situation where when a filter 202 is inserted at the boundary of an incidence medium 201 and a transmission medium 203, an elastic wave 204 entering vertically (at an angle of incidence of 0°) undergoes mode conversion, thereby being transmitted (reference symbol "205").

FIG. 2B is a drawing illustrating a situation where when a filter 207 is inserted at the boundary of an incidence medium 206 and a transmission medium 208, an elastic wave 209 entering obliquely at a target angle of incidence of $\theta_{target}$ undergoes mode conversion, thereby being transmitted (reference symbol "210").

FIG. 2C is a drawing illustrating a situation where when a filter 212 according to an exemplary embodiment is inserted at the boundary of an incidence medium 211 and a transmission medium 213, elastic waves 214 entering over a wide range of angle of incidence undergoes mode conversion, thereby being transmitted (reference symbol "215").

FIG. 2D is a drawing illustrating a graph of transmittances of filters during mode conversion according to the related arts (a dotted line, 216, 217) and the exemplary embodiment (a solid line, 218) during mode conversion from longitudinal waves to transverse waves depending on angles of incidence Related Art 1 (reference symbol "216") shows high mode-converting transmittances only when the angle of incidence is near a target angle of incidence of $\theta_{target1}$ of 0°. Related Art 2 (reference symbol "217") shows high mode-converting transmittances only when the angle of incidence is near a target angle of incidence of $\theta_{target2}$ of 60°. However, the case of using the filter according to the exemplary embodiment (reference symbol "218") shows mode-converting transmittances of nearly 100% over a wide range of angle of incidence (from about 0° to about 70°).

The filter according to the exemplary embodiment may be implemented with an anisotropic material existing in nature or an elastic metamaterial which is an array in which microstructures smaller than a wavelength are continuously arranged. In this case, the repeating structures which constitute the continuous array are referred to as unit cells. The boundary shape of the unit cells in the filter may be a polygonal shape, such as a rectangular shape, a parallelogrammic shape, a hexagonal shape, etc., in two dimensions.

In addition, the boundary shape of the unit cells in the filter may be a polyhedral shape such as a hexahedral shape, a prismatic shape, etc., in three dimensions.

Exemplary embodiments present examples of unit-cell microstructures of elastic metamaterials and the boundary shapes of unit cells. For example, FIG. 3A, FIG. 3B, and FIG. 3C are drawings illustrating examples of microstructures of unit cells, and FIG. 3D, FIG. 3E, and FIG. 3F are drawings illustrating examples of the boundary shapes of unit cells.

Figure 3A:
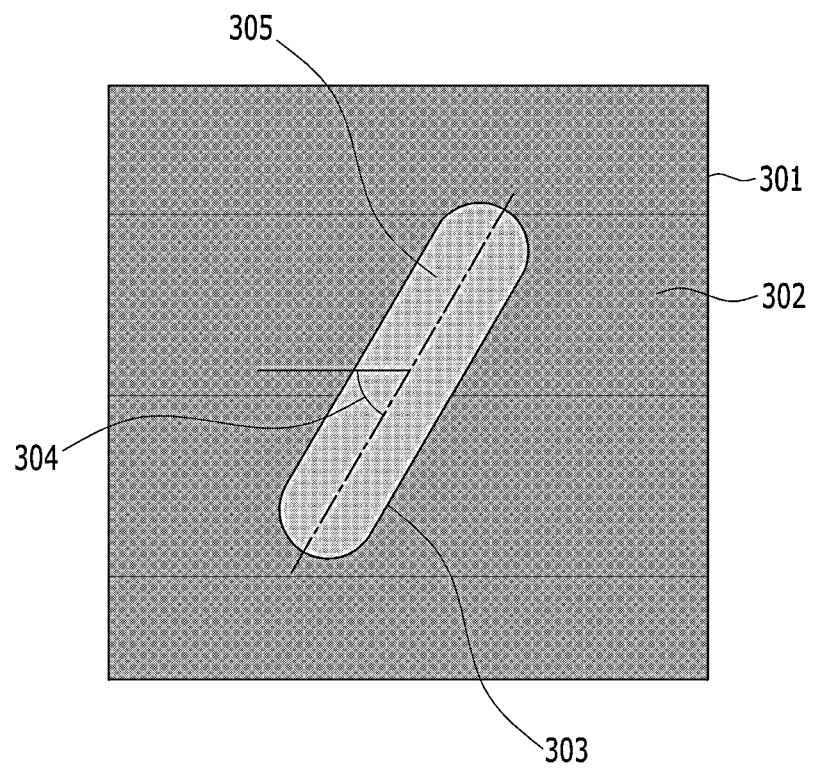
FIG. 3A, FIG. 3B, and FIG. 3C are drawings illustrating examples of microstructures of unit cells.

FIG. 3A is a drawing illustrating a unit cell 301 including a microstructure 305 having the shape of a slit 303 inclined at an arbitrary angle 304 in a two-dimensional plane. A material 302 which constitutes the unit cell 301 and a material which constitutes the microstructure 305 are not limited, and may be different from each other. The microstructure 305 may be a void.

Figure 3B:
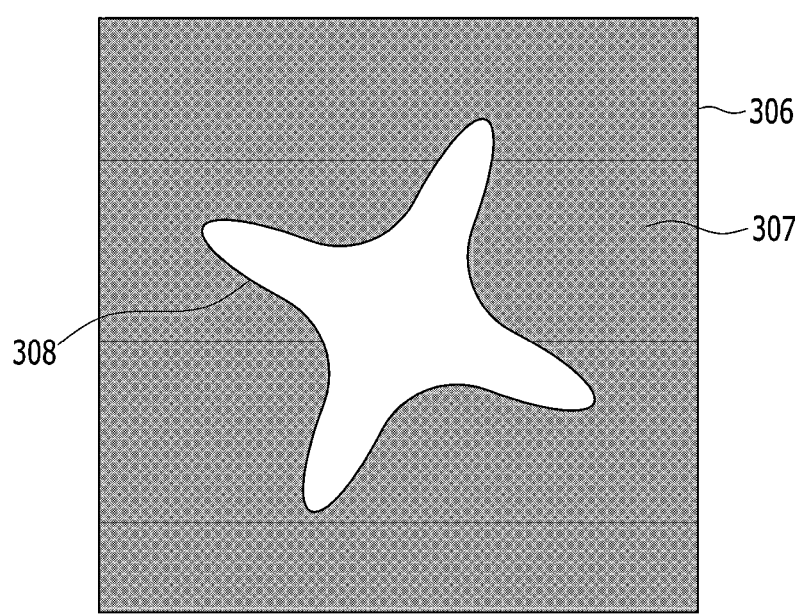

FIG. 3B is a drawing illustrating an example of a unit cell 306 having a microstructure 308 with an irregular shape in a material 307 constituting the unit cell 306. The shape and arrangement of the microstructure 308 are not limited.

Figure 3C:
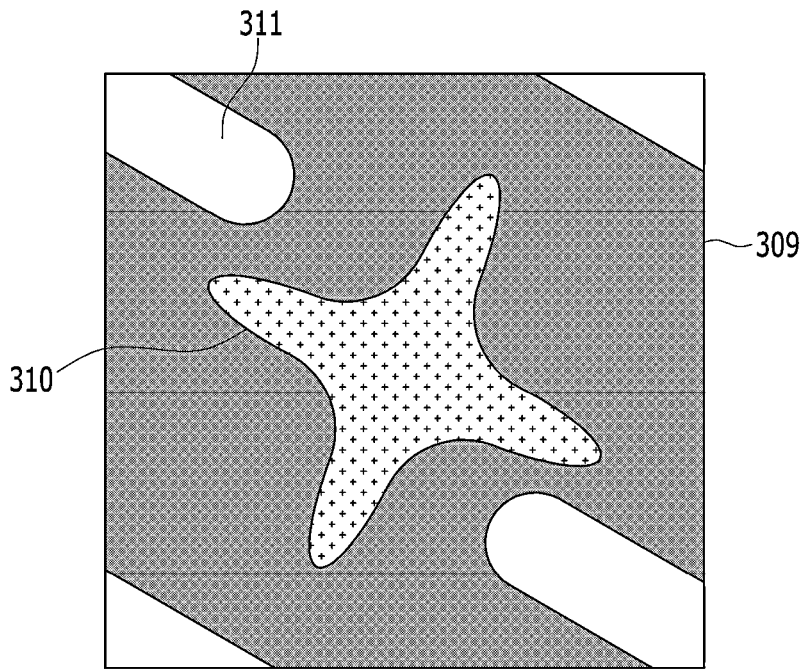
Figure 3D:
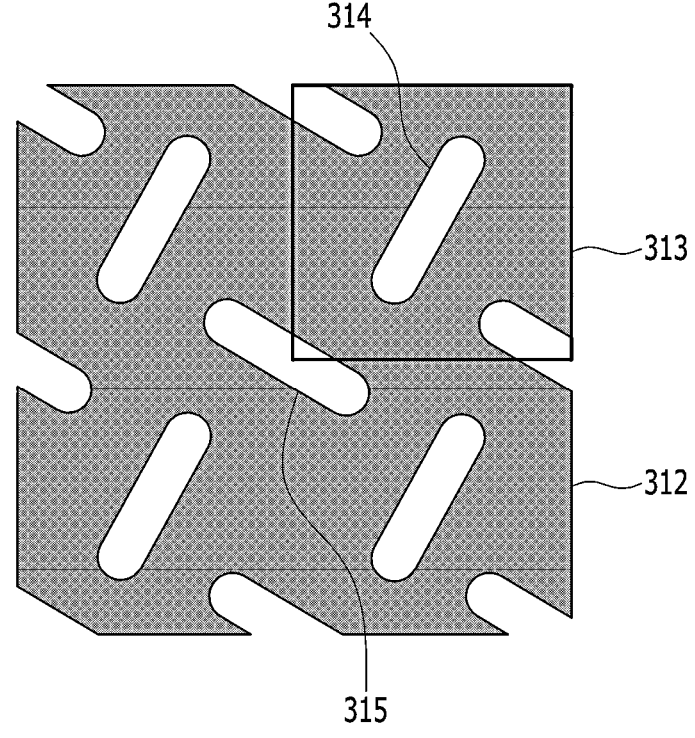
FIG. 3D, FIG. 3E, and FIG. 3F are drawings illustrating examples of the boundary shapes of unit cells.
Figure 3E:
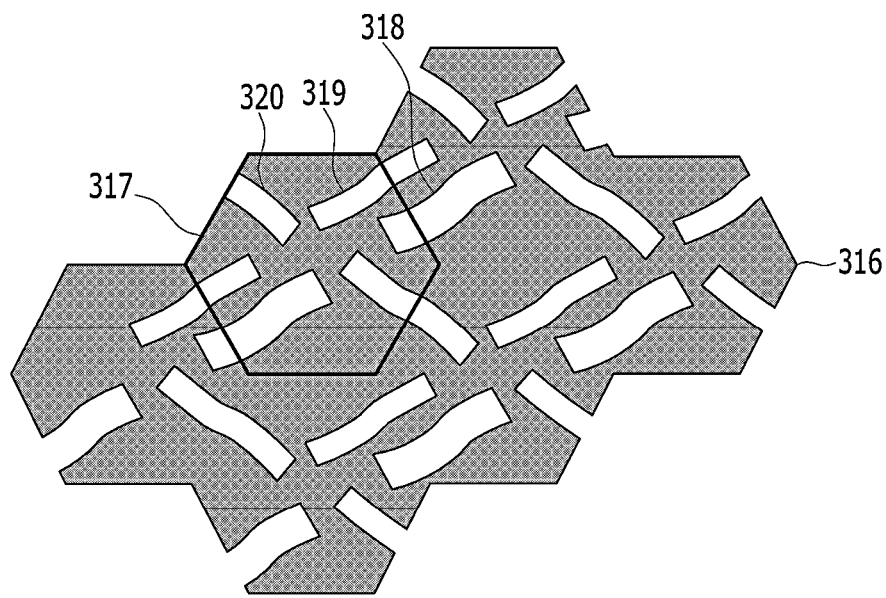
Figure 3F:
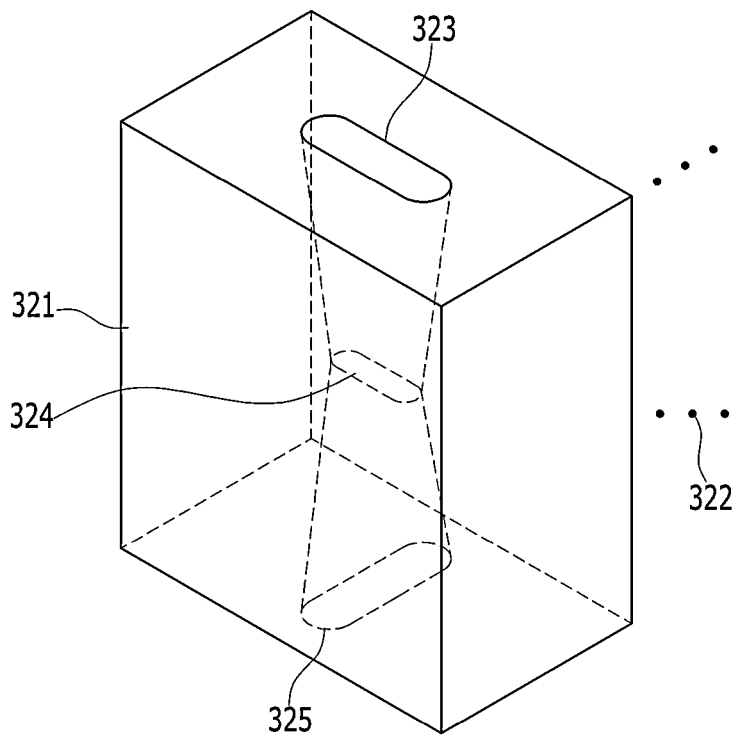

FIG. 3C is a drawing illustrating an example of a unit cell 309 having several microstructures 310 and 311. The number of microstructures 310 and 311 existing in the unit cell 309 may be two or greater, and the shapes and constituent materials of the microstructures 310 and 311 may be different from each other.

FIG. 3D is a drawing illustrating a 2-by-2 array 312 for a square-shaped unit cell 313 which has two different kinds of microstructures 314 and 315 and constitutes the filter.

FIG. 3E is a drawing illustrating a 2-by-3 array 316 for a hexagon-shaped unit cell 317 which has three different kinds of microstructures 318, 319, and 320 and constitutes the filter.

FIG. 3F is a drawing illustrating a unit cell 321 having an arbitrary thickness in a three-dimensional space. The unit cell 321 may be periodically arranged in three dimensions (reference symbol "322"), thereby constituting a filter. The cross section shapes of microstructures 323, 324, and 325 in the unit cell 321 having a three-dimensional shape may vary along the thickness direction.

The principle of operation of the filter provided for wide-angle mode conversion according to the exemplary embodiment will be described. In order to fully transmit a longitudinal wave entering a filter at a single target angle of incidence without reflected waves by performing mode conversion from the longitudinal wave to a transverse wave, the filter should satisfy a generalized phase and impedance matching condition. In this case, in order for the filter according to the exemplary embodiment to satisfy the generalized phase and impedance matching condition over a wide range of angle of incidence (from about 0° to about 70°) rather than a single target angle of incidence, the filter may be manufactured by elaborately designing the shape of an elastic metamaterial. By using a filter designed in the above-mentioned way, it is possible to realize the full mode-converting transmission phenomenon of elastic waves over a wide range of angle of incidence.

FIG. 4A is a drawing illustrating the shape of a unit cell of an elastic metamaterial used for realizing wide-angle mode conversion in an exemplary embodiment, and a situation where wide-angle mode conversion from longitudinal waves to transverse waves is realized using that. Twenty-two design variables shown in FIG. 4A may be appropriately adjusted to design a filter 404 to be provided for wide-angle mode conversion. For example, the twenty-two design variables are $L_x$, $L_y$, $\theta_{1a}$, $I_{1a}$, $r_{1a}$, $\theta_{1b}$, $I_{1b}$, $r_{1b}$, $x_{1a}$, $y_{1a}$, $x_{1b}$, $y_{1b}$, $\theta_{2a}$, $I_{2a}$, $r_{2a}$, $\theta_{2b}$, $I_{2b}$, $r_{2b}$, $\theta_{2c}$, $I_{2c}$, $r_{2c}$, and w.

FIG. 4B and FIG. 4C are drawings illustrating transmittance of the filter 404 provided for wide-angle mode conversion according to the exemplary embodiment during mode conversion from longitudinal waves to transverse waves and transmittance of the filter during mode conversion from longitudinal waves to longitudinal waves, respectively. According to the exemplary embodiment, any frequencies and any incidence and transmission media are applicable. In an experimental example, it was assumed that the frequency is 100 KHz and the incidence and transmission media are aluminum without losing generality. The transmittance during mode conversion was calculated on the basis of the results of simulation analysis using commercial numerical analysis software (COMSOL Multiphysics). The design variables of the filter were designed as follow: $L_x=10$ mm, $L_y=30$ mm, $\theta_{1a}=16.854$ degrees, $I_{1a}=3.357$ mm, $r_{1a}=1.967$ mm, $\theta_{1b}=27.140$ degrees, $I_{1b}=2.817$ mm, $r_{1b}=2.036$ mm, $x_{1a}=0.953$, $y_{1a}=0.958$, $x_{1b}=0.938$, $y_{1b}=0.974$, $\theta_{2a}=14.809$ degrees, $I_{2a}=3.230$ mm, $r_{2a}=1.990$ mm, $\theta_{2b}=71.4889$ degrees, $I_{2b}=4.201$ mm, $r_{2b}=1.360$ mm, $\theta_{2c}=8.088$ degrees, $I_{2c}=2.316$ mm, $r_{2c}=1.625$ mm, and w=5 mm.

The filter 404 shown in FIG. 4A may include an array 405 of unit cells 408. Each unit cell 408 is produced by forming five different slit-like empty holes, and the transverse length and longitudinal length of the corresponding unit cell are $L_x$ and $L_y$, respectively. Two holes 409 and 410 which are on the inner side of a unit cell have six design variables $\theta_{1a}$, $I_{1a}$, $r_{1a}$, $\theta_{1b}$, $I_{1b}$, and $r_{1b}$ that determine their shapes, and four design variables $x_{1a}$, $y_{1a}$, $x_{1b}$, and $y_{1b}$ that determine their positions.

Here, the six design variables that determine the shapes may include the rotation angles $\theta_{1a}$ and $\theta_{1b}$ of the holes, the lengths $I_{1a}$ and $I_{1b}$ of the holes, and the thicknesses $r_{1a}$ and $r_{1b}$ of the holes. Further, the four design variables that determine the positions may include x-direction positions $x_{1a}$ and $x_{1b}$ and y-direction positions $y_{1a}$ and $y_{1b}$.

Three holes 411, 412, and 413 which are on the outer side of a unit cell have nine design variables $\theta_{2a}$, $I_{2a}$, $r_{2a}$, $\theta_{2b}$, $I_{2b}$, $r_{2b}$, $\theta_{2c}$, $I_{2c}$, and $r_{2c}$ that determine their shapes, and one design variable w (see the reference symbol "413") that determines their positions. Here, the nine design variables that determine the shapes may include the rotation angles $\theta_{2a}$, $\theta_{2b}$, and $\theta_{2c}$ of the holes, the lengths $I_{2a}$, $I_{2b}$, and $I_{2c}$ of the holes, and the thicknesses $r_{2a}$, $r_{2b}$, and $r_{2c}$ of the holes. The one design variable that determines the positions is a y-direction length w (see the reference symbol "413").

A longitudinal wave 401 entering the presented filter 404 according to the exemplary embodiment may be converted into a transverse wave 406 without being reflected over a wide range of angle of incidence (the reference symbol "402"), thereby being transmitted with high energy efficiency equal to or higher than about 99%. The refraction angle 407 of the longitudinal wave which is transmitted at that time may be determined according to the angle of incidence of the wave and the properties of a background medium.

According to the exemplary embodiment, the microstructures which gradually vary in the propagation direction of waves as described above make it possible wide-angle mode conversion which has not been able to be realized by simply repeating a specific structure as in the existing mode conversion technology.

FIG. 4B is a drawing illustrating a graph of the transmittance of the filter during mode conversion from longitudinal waves to transverse waves. Referring to FIG. 4B, over a wide range of angle of incidence of longitudinal waves from about 0° to about 70°, full mode-converting transmission of elastic waves can be realized with high energy efficiency close to about 100%. FIG. 4C is a drawing illustrating a graph of the transmittance of the filter during mode conversion from transverse waves to longitudinal waves. Referring to FIG. 4C, similarly, over a wide range of angle of incidence of transverse waves, full mode-converting transmission of elastic waves can be realized with high energy efficiency close to 100%. By the way, it can be seen that unlike mode conversion from longitudinal waves to transverse waves, mode conversion from transverse waves to longitudinal waves is valid only when the angles of incidence of transverse waves are smaller than a critical angle $\theta_{critical}$ by Snell's law.

The results of simulation analysis from which it is possible to verify the performance of filters designed according to the exemplary embodiment will be presented. FIG. 5 is a drawing illustrating the results of simulation analysis in which longitudinal waves entering at various angles of incidence (about 0°, about 20°, about 40°, and about 60°) are converted into transverse waves, thereby being fully transmitted, when filters 502 and 508 designed in advance are inserted at the boundaries of aluminum. FIG. 6 is a drawing illustrating the results of simulation analysis in which transverse waves entering at various angles of incidence (about 0°, about 10°, about 20°, and about 30°) are converted into longitudinal waves, thereby being fully transmitted, when filters 602 and 609 designed in advance are rotated 180 degrees and are inserted at the boundaries of aluminum.

FIG. 5 is a drawing illustrating the results of simulation analysis of divergence fields and curl fields when longitudinal waves 504, 505, 506, and 507 entered the filters 502 and 508 provided for wide-angle mode conversion. The divergence fields and the curl fields are proportional to the displacement amplitudes of the longitudinal waves and the transverse waves, respectively. As the divergence fields are seen, the incident longitudinal waves are observed in incidence media 501, but are rarely observed in transmission media 503. In contrast, as the curl fields are seen, incident longitudinal waves are rarely observed in incidence media 508, but transverse waves 511, 512, 513, and 514 fully transmitted by mode conversion may be observed in transmission media 510. In other words, it can be seen that the longitudinal waves entering the filters 502 and 508 are converted into the transverse waves which are fully transmitted, and reflection does not occur.

FIG. 6 is a drawing illustrating the results of simulation analysis of divergence fields and curl fields when transverse waves 604, 605, 606, and 607 entered the filters 602 and 609 provided for wide-angle mode conversion. As the curl fields are seen, the incident transverse waves are observed in incidence media 601, but are rarely observed in transmission media 603. In contrast, as the divergence fields are seen, incident transverse waves are rarely observed in incidence media 608, but longitudinal waves 611, 612, 613, and 614 fully transmitted by mode conversion may be observed transmission media 610. In other words, it can be seen that the transverse waves entering the filters 602 and 609 are converted into the longitudinal waves which are fully transmitted, and reflection does not occur.

As described above, the full transmission device for wide-angle mode conversion of elastic waves according to the exemplary embodiment can realize free mode conversion between longitudinal waves and transverse waves without reflected waves over a wide range of angle of incidence by using anisotropy, and be applied to the development of high-efficiency elastic wave equipment. For example, the full transmission device for wide-angle mode conversion of elastic waves according to the exemplary embodiment may be particularly applied to medical ultrasound equipment, industrial ultrasound equipment, etc., requiring high mode conversion ratio or low reflection ratio.

While this invention has been described in connection with what is presently considered to be practical exemplary embodiments, it is to be understood that the invention is not limited to the disclosed exemplary embodiments. On the contrary, it is intended to cover various modifications and equivalent arrangements included within the spirit and scope of the appended claims.

The invention claimed is:

1. A full transmission device for wide-angle mode conversion of elastic waves, the device comprising:
an incidence medium that elastic waves including longitudinal waves and transverse waves enter obliquely within a preset wide angle range;
a transmission medium that transmits elastic waves when the elastic waves enter the transmission medium within the wide angle range through the incidence medium; and
a filter that is formed so as to satisfy a wide-angle mode conversion full-transmission condition when the filter is interposed between the incidence medium and the transmission medium, such that elastic waves entering the incidence medium within the wide angle range are completely converted without being reflected so as to be transmitted to the transmission medium,
wherein the filter includes an elastic metamaterial that is smaller than an wavelength of the elastic waves entering the incidence medium, and the elastic metamaterial includes at least one microstructure with a continuous array and tilted with respect to an incidence direction of the elastic wave or asymmetric with respect to an incidence axis of the elastic wave, wherein the wide-angle mode conversion full-transmission condition includes a plurality of design variables, and a plurality of microstructures which is formed in a shape preset by the plurality of design variables is continuously arranged so as to gradually vary in a propagation direction of waves, thereby forming repeating unit cells, and
wherein two holes that are on an inner side of a unit cell are formed by a combination of six design variables $\theta_{1a}, l_{1a}, r_{1a}, \theta_{1b}, l_{1b},$ and $r_{1b}$ that determine shapes of the two holes and four design variables $x_{1a}, y_{1a}, x_{1b},$ and $y_{1b}$ that determine positions of the two holes.

2. The full transmission device for wide-angle mode conversion of elastic waves according to claim 1, wherein the microstructure has slit-like voids.

3. The full transmission device for wide-angle mode conversion of elastic waves according to claim 2, wherein the microstructure is formed in a shape that is inclined at a preset angle in a two-dimensional plane.

4. The full transmission device for wide-angle mode conversion of elastic waves according to claim 1, wherein the plurality of design variables includes a plurality of shape design variables that determines a shape of the microstructure, and a plurality of position design variables that determine a position of the microstructure.

5. The full transmission device for wide-angle mode conversion of elastic waves according to claim 2, wherein the plurality of design variables includes twenty-two design variables $L_x, L_y, \theta_{1a}, l_{1a}, r_{1a}, \theta_{1b}, l_{1b}, r_{1b}, x_{1a}, y_{1a}, x_{1b}, y_{1b}, \theta_{2a}, l_{2a}, r_{2a}, \theta_{2b}, l_{2b}, r_{2b}, \theta_{2c}, l_{2c}, r_{2c},$ and w.

6. The full transmission device for wide-angle mode conversion of elastic waves according to claim 1, wherein three holes that are on an outer side of an unit cell are formed by a combination of nine design variables $\theta_{2a}, l_{2a}, r_{2a}, \theta_{2b}, l_{2b}, r_{2b}, \theta_{2c}, l_{2c},$ and $r_{2c}$ that determine shapes of the three holes and one design variable w that determines positions of the three holes.

* * * * *